METHOD FOR ALIGNMENT OF MICROCIRCUIT DEVICES ON SUBSTRATE

Filed Feb. 16, 1967 2 Sheets-Sheet 1

INVENTOR
C. W. WELLER
BY [signature]
ATTORNEY

United States Patent Office 3,457,639
Patented July 29, 1969

3,457,639
METHOD FOR ALIGNMENT OF MICROCIRCUIT DEVICES ON SUBSTRATE

Charles W. Weller, Middlesex, N.J., assignor to Bell Telephone Laboratories, Incorporated, Murray Hill, N.J., a corporation of New York Filed Feb. 16, 1967, Ser. No. 616,626
Int. Cl. H05k *3/30;* H01l *1/16*
U.S. Cl. 29—626 8 Claims

ABSTRACT OF THE DISCLOSURE

It placing microminature circuit elements such as beam lead transistors on a substrate, accurate alignment with the corresponding conducting paths on the substrate is asured by covering the substrate surface with a photoresist, removing the photoresist by a photographic process in those areas in which the circuit elements are to be placed and bonded, and placing the elements in the photoresist depressions formed thereby.

Background of the invention

*Field of the invention.*—This invention relates to microelectronic circuitry and more particularly to a method for assembling such circuitry.

*Description of the prior art.*—The term microelectronic circuitry, or more commonly microcircuitry, is typically applied to circuit combinations that are sufficiently small to require the use of a microscope during the assembly or fabrication process. Circuit of this type are now employed in a number of areas in industry including, for example, computers and various electronic systems peculiar to aerospace and military work.

Microcircuits are not restricted to any particular form but instead span a whole spectrum of circuit types and combinations that include monolithic chips, thin film networks and networks of discrete microminiature circuit elements. Owing to a number of potential advantages that include small bulk, high reliability and low cost, it would appear that widespread microcircuit usage at an accelerated rate is virtually assured. Currently, however, there are problems involving the assembly of microcircuits that severely limit the attainment of their full potential insofar as reliability and cost are concerned. These problems stem directly from the obvious difficulties involved in making a plurality of separate circuit interconnections within a microscopic space. Such connections are required for example, between the leads of microminiature circuit elements such as beam lead transistors and the corresponding conductive strips that are deposited on a supporing substrate. A specific problem heretofore unsolved involves aligning the discrete circuit elements properly with the conductive strips to ensure accurate bonding and maximum conductive contact. Any slight misalignment can reduce the reliability of the contact and misalignment to any substantial degree may result in no conact at all or in contacts other than the intended contacts. Prior art mehods of securing proper alignmen involve laborious manual positioning or manual positioning aided by vacuum probes.

Summary of the invention

Accordingly, an object of the invention is to simplify the positioning of microminiature circuit elements on supporting substrates thereby to enhance the reliability of contact between the element leads and the corresponding conductors on the substrate.

This object and related objects are achieved in accordance with the principles of the invention by the employment of a novel that positively ensures proper alignment between microminiature circuit elements and corresponding portions of the underlying substrate without regard to the manual dexterity of the assembler. Specifically, the substarate surface and the conducting paths supported thereby are covered with a photoresist or other coating material. The coating material is typically nonconductive but conductive material may also be employed so long as an intimate conductive bond is avoided between the coating and the conducting paths on the substrate. By using a suitably formed mask and a photographic process, or a comparable etching process, the photoresist or other coating material is removed from those areas where the circuit elements are to be placed and bonded. Exact alignment is then ensured simply by placing the circuit elements in the depression this formed.

Alternatively, the object of the invention may be achieved by selectively depositing coating material over the entire substrate omitting, however, those areas in which the circuit elements are to be placed. In such a process the step of removing the coating material to form the depression is eliminated.

Description of the drawing

The principles of the invention together with additional objects and features thereof will be fully apprehended from the following detailed descrption of an illustrative method embodying the features of the invention and from the appended drawing in which.

Description of an embodiment

Figure 1:
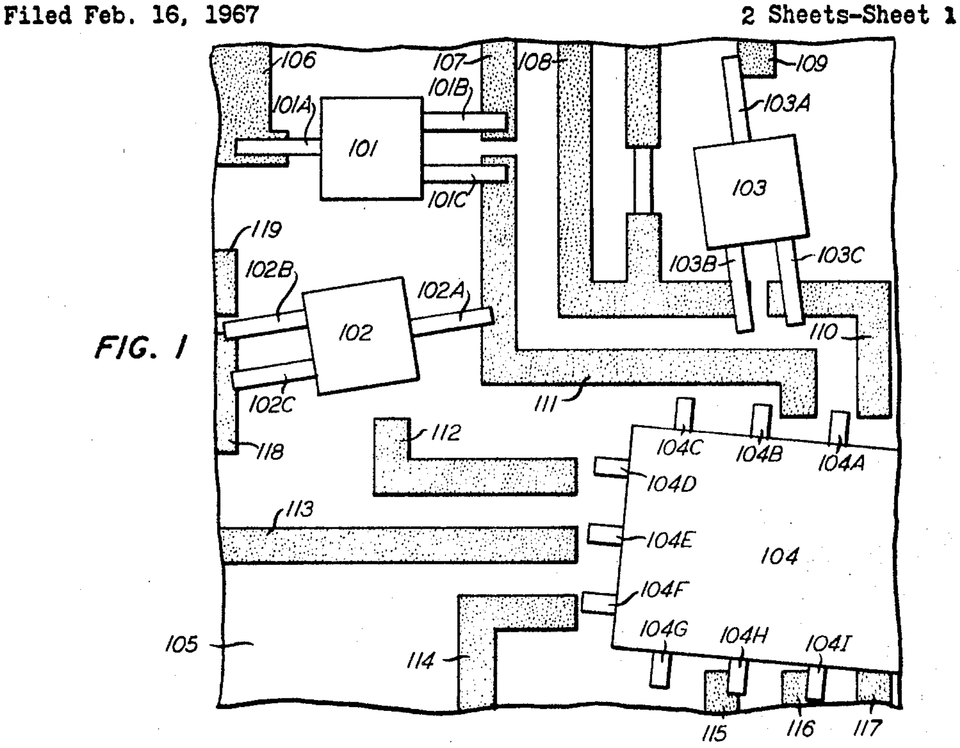
FIG. 1 is a sketch of misaligned microminiature circuit elements on a supporting substrate.
Figure 2:
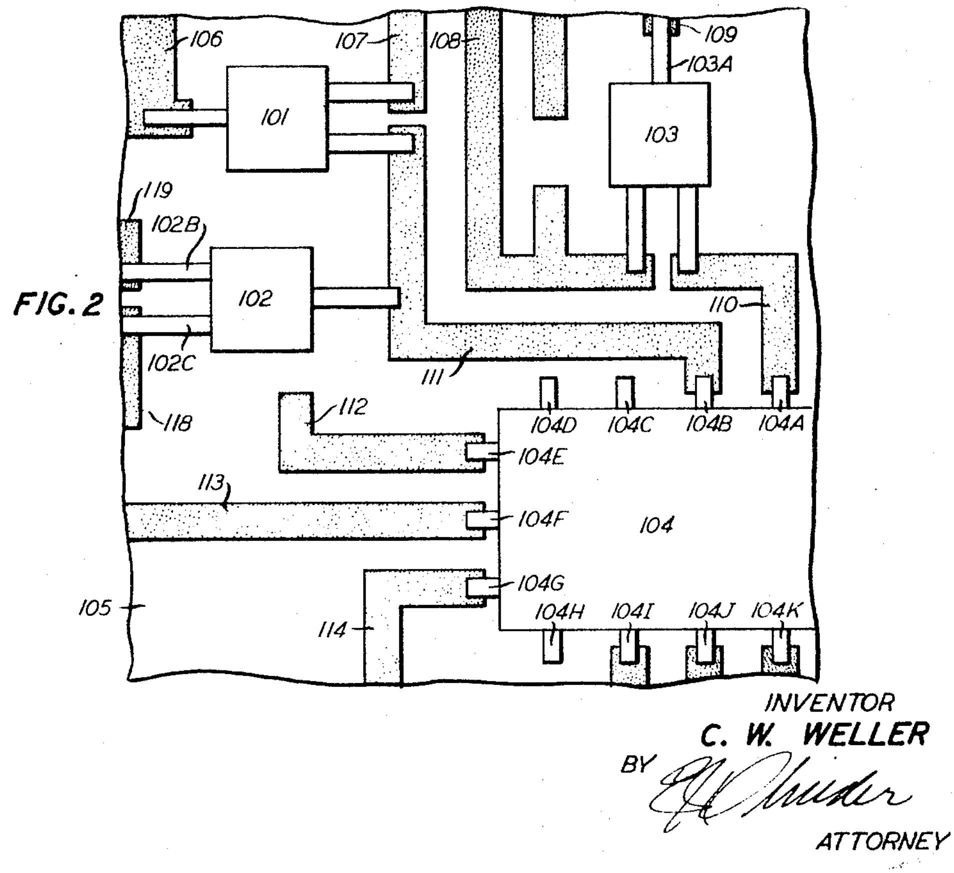
FIG. 2 is a sketch of properly aligned microminiature circuit elements on a supporting substrate.

In FIG. 1 an underlying nunconductive substrate 105, which may be conventionally formed from a suitable phenolic, fiber glass, plastic or the like, supports a pattern of conductive strips 106–119 which may be formed from gold, copper or other conductive material. The strips 106–119 may be affixed to the substrate 105 by any one of a number of conventional techniques including masking and spraying, for example. The circuit includes beam lead transistors 101, 102 and 103 and an integrated circuit package 104 which may be formed from a silicon chip, for example.

In the assembly of a circuit of the type shown in FIG. 1, circuit elements 101–104 must be precisely aligned to ensure that the element leads are exactly superimposed on preselected ones of the conducting strips 106–119 so that the final circuit as fabricated corresponds to the circuit as designed. As indicated above, element alignment in the prior art is typically effected by working with simple hand tools under a microscope. Alternatively, vacuum probes, also hand manipulated, may be employed.

Owing to the difficulty inherent in aligning the device leads with the proper conducting paths, misalignment often occurs as illustrated in FIG. 1. For example, leads 104A and 104B, designed for placement on the conducting paths 107 and 110 respectively, are clearly out of contact with those paths. The same condition obtains for the leads 104D and 104E with respect to the paths 112 and 113. Lead 104F is barely in contact with path 114. Leads 104B, 104C and 104G are intended to be open-circuited as shown.

Observations similar to the foregoing can be made with respect to the beam lead transistors 102 and 103, both of which are out of alignment. Only beam lead transistor 101 has been properly positioned so that the leads

101A, 101B and 101C are superimposed over conducting paths 106, 107 and 111, respectively.

Figure 3:
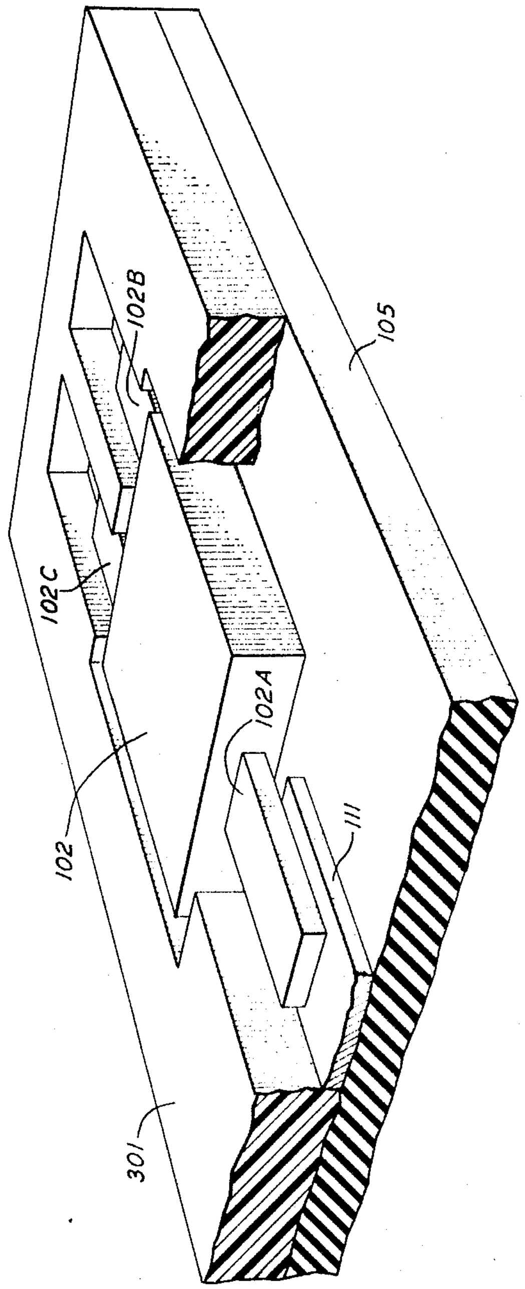
FIG. 3 is a sketch shown in perspective of a beam lead transistor positioned on a supporting substrate in accordance with the invention.

The beam lead transistor 102 shown in FIG. 1 is also shown in FIG. 3, properly positioned, however, through a method in accordance with the invention. After the conductive paths, such as path 111, have been affixed to the substrate 105, the substrate 105 and the conductive paths are covered with a coating of photoresist material which may be on the order of 2 mils in thickness. One suitable material is Azoplate 340, a readily available commercial photo emulsion. Application of the coating of photoresist may be effected by the following procedure:

spray for 1 minute,
dry for 5 minutes,
spray for 1 minute,
dry for 5 minutes,
spray for 1 minute,
air dry for 20 minutes,
bake at 80° C. for 20 minutes.

The next step in the process is the fabrication of a high resolution glass mask with unmasked portions corresponding in shape and location to each circuit element that is to be positioned on the substrate. With the glass mask in registry with the substrate and its conductive paths, the assembly is exposed to an ultraviolet light source for a period of approximately five minutes. The photoresist covered substrate is then developed for a period of approximately 90 seconds with any suitable commercial developer, such as Azoplate 300.

In the resulting structure, as shown in FIG. 3, the photoresist 301 has been removed to form a depression that accommodates the beam lead transistor 102 and its leads 102A, 102B and 102C.

Illustrative dimensions of the assembly shown in FIG. 3 are as follows:

| Element: | Mils |
|---|---|
| Transistor **301** body length | 6 |
| Transistor **301** body width | 8 |
| Beam lead **102A** length | 8 |
| Beam lead **102A** width | 1.6 |
| Beam lead **102A** thickness | 0.5 |
| Photoresist **301** thickness | 2 |
| Conductive path **111** thickness | 0.1 |
| Gap between edges of beam lead **102A** and photoresist wall **301** | 0.2 |

Each device such as the beam lead transistor 102 may be affixed to the underlying substrate at the bottom of the accommodating photoresist depression by a suitable bonding method. Leads such as the lead 102A are conductively bonded to the underlying conductive paths which may be effected by conventional thermocompression bonding techniques, for example.

Although the method of the invention has been described herein in terms of employing a substrate covering of photoresist material, it will be apparent to persons skilled in the art that the inventive concept also encompasses the utilization of other coating materials including various plastics and the like which may be removed in selective patterns by the use of echants.

As indicated above, the principles of the invention may also be exploited by selectively depositing a suitable coating material, as by masked spraying, for example, over all areas of the substrate except those areas in which the circuit elements are to be placed. In this fashion depressions are formed without the step of removing portions of the coating material.

Moreover, it is to be understood that the methods described herein are merely illustrative of the principles of the invention. Various modifications may be devised by persons skilled in the art without departing from the spirit and scope of the invention.

What is claimed is:

1. A method for aligning a multiterminal microcircuit device with an underlying supporting substrate thereby to ensure proper registration between said terminals and corresponding conducting portions supported by said substrate consisting of the steps of coating on said substrate and said conductive portions a layer of nonconductive material, selectively removing a portion of said material corresponding to the desired position of said device with respect to said substrate and with respect to said conducting portions, thereby to form a depression in said material accommodating said device, placing said device in said depression, and bonding said terminals to corresponding areas of said conductive portions.

2. A method in accordance with claim 1 wherein said nonconductive material is a photoresist.

3. A method in accordance with claim 2 wherein said removing involves the utilization of a photographic process.

4. A method in accordance with claim 3 wherein said process includes the further steps of exposing said portion of said material by means of a suitable masking element to a source of ultraviolet light for a first preselected period and developing said photoresist for a second preselected period.

5. A method for aligning a multiterminal microcircuit device with a supporting substrate, said substrate including conductive paths thereon designed for connection to said terminals consisting of the steps of covering said substrate and said conductive paths with a plastic nonconductive coating, selectively etching away a portion of said coating to form a depression exposing a portion of said substrate and portions of said conductive paths, said depression accommodating said device, placing said device in said depression, and bonding said terminals to corresponding portion of said paths.

6. A method for aligning a multiterminal microcircuit device with a supporting substrate, said substrate including conductive paths thereon designed for connection to said terminals, consisting of the steps of alternately spraying and drying successive layers of a photoresist material covering said substrate and said paths thereby to form a coating of said material, baking said coating at a temperature of approximately 80° C. for a period of about twenty minutes, exposing a portion of said coating to a source of ultraviolet light through a mask for a period of about five minutes, developing away said exposed portions for a period of about ninety seconds thereby to form a depression in said layers exposing a portion of said substrate and portions of said paths, said depression accommodating said device, placing said device in said depression, bonding said device to said substrate, and bonding said terminals to said exposed portions of said paths.

7. A method in accordance with claim 6 wherein said photoresist material is Azoplate 340.

8. The method in accordance with claim 6 wherein said developing step employs Azoplate 300.

References Cited

UNITED STATES PATENTS

| | | | |
|---|---|---|---|
| 2,805,968 | 9/1957 | Dunn. | |
| 3,290,756 | 12/1966 | Dreyer | 29—626 |

FOREIGN PATENTS

| | | |
|---|---|---|
| 1,027,550 | 4/1966 | Great Britain. |

OTHER REFERENCES

"Proceedings of the IEEE," December 1964, pages 1655–1657.

JOHN F. CAMPBELL, Primary Examiner

W. I. BROOKS, Assistant Examiner

U.S. Cl. X.R.

29—577, 578, 590; 96—36.2